US012671262B2

(12) United States Patent
Gustafsson

(10) Patent No.: US 12,671,262 B2
(45) Date of Patent: Jun. 30, 2026

(54) ELECTRICAL PULSE GENERATING DEVICE

(71) Applicant: Nodica Group AB, Uppsala (SE)

(72) Inventor: Jonas Gustafsson, Uppsala (SE)

(73) Assignee: Nodica Group AB (SE)

( * ) Notice: Subject to any disclaimer, the term of this patent is extended or adjusted under 35 U.S.C. 154(b) by 685 days.

(21) Appl. No.: 18/018,232

(22) PCT Filed: Jul. 14, 2021

(86) PCT No.: PCT/EP2021/069622
§ 371 (c)(1),
(2) Date: Jan. 26, 2023

(87) PCT Pub. No.: WO2022/023042
PCT Pub. Date: Feb. 3, 2022

(65) Prior Publication Data
US 2023/0268752 A1 Aug. 24, 2023

(30) Foreign Application Priority Data
Jul. 29, 2020 (EP) ..................................... 20188453

(51) Int. Cl.
| | |
|---|---|
| *H02J 7/00* | (2026.01) |
| *H02J 7/34* | (2006.01) |
| *H02J 7/90* | (2026.01) |
| *H03K 17/567* | (2006.01) |
| *H03K 17/687* | (2006.01) |

(52) U.S. Cl.
CPC .............. *H02J 7/927* (2026.01); *H02J 7/345* (2013.01); *H03K 17/567* (2013.01); *H03K 17/687* (2013.01)

(58) Field of Classification Search
CPC .................................................... H02J 7/00711
USPC ......................................................... 320/166
See application file for complete search history.

(56) References Cited

U.S. PATENT DOCUMENTS

| | | | |
|---|---|---|---|
| 5,515,011 A | 5/1996 | Pasco | |
| 5,905,646 A | 5/1999 | Crewson et al. | |
| 8,115,343 B2 | 2/2012 | Sanders et al. | |
| 8,115,434 B2 | 2/2012 | El-antably et al. | |
| 9,531,353 B2 | 12/2016 | Iskander et al. | |
| 2016/0003633 A1* | 1/2016 | Suzuki ................... | G01C 21/34 |
| | | | 701/533 |

(Continued)

FOREIGN PATENT DOCUMENTS

| | | | |
|---|---|---|---|
| CN | 2622933 Y | 6/2004 | |
| CN | 207399158 U | 5/2018 | |
| WO | WO-2019068769 A1 * | 4/2019 | ............. H03K 3/021 |

*Primary Examiner* — Yalkew Fantu
(74) *Attorney, Agent, or Firm* — Condo Roccia Koptiw LLP

(57) ABSTRACT

An electrical pulse generating device is disclosed which comprises a switching unit configured such that the electrical conductivity of a current path through the switching unit is controllable by transmission of a modulated digital drive signal to the switching unit, whereby the switching unit is controllably switchable between different operational states thereof based on the digital drive signal. A shape of the electrical pulse created by the discharge of the electrical energy storage module is at least in part governed by the modulation of the digital drive signal. The modulated digital drive signal is generated based on a selected electrical pulse shape.

15 Claims, 5 Drawing Sheets

(56) References Cited

U.S. PATENT DOCUMENTS

2016/0182030 A1* 6/2016 Lee ......................... H03K 7/10
                                                      332/108
2018/0083525 A1* 3/2018 Abu-Hajar .............. H02M 1/12

* cited by examiner

1

ELECTRICAL PULSE GENERATING DEVICE

CROSS REFERENCE TO RELATED APPLICATIONS

This application is the National Stage Entry under 35 U.S.C. § 371 of Patent Cooperation Treaty Application No. PCT/EP2021/069622, filed 14 Jul. 2021, which claims benefit from EPC patent application No. 20188453.3, filed 29 Jul. 2020, the contents of each of which are hereby incorporated by reference herein in their entireties.

TECHNICAL FIELD

The present invention generally relates to the field of electrical equipment. Specifically, the present invention relates to an electrical pulse generating device.

BACKGROUND

Electrical pulses may be employed in a variety of applications, such as, for example, radar systems, particle accelerators, sterilization equipment, high-energy lasers, microwave systems, or medical devices. In such and other applications it may be desired or required to deliver one or more electrical pulses to a load.

An electrical energy storage unit or module such as a capacitor may be used to store electrical energy, which when discharged generates an electrical pulse that can be delivered to the load, or to a pulse transformer. The capacitor may be repeatedly charged by a power supply unit or arrangement connected to a power source. The capacitor may be repeatedly or cyclically charged and discharged in order to generate a plurality of successive electrical pulses. Arrangements, systems or circuits which are employed for generating electrical pulses may be referred to as power modulators. Power modulators may employ a pulse transformer in order to obtain the required or desired voltage of the electrical pulses.

SUMMARY

An electrical pulse generating device in a power modulator may employ a power supply and an electrical energy storage module that can be charged or discharged. The electrical energy storage module may for example comprise a capacitor or several capacitors (e.g., a capacitor bank). Electrical pulses may be generated by repeatedly or cyclically charging and discharging the electrical energy storage module, wherein when the electrical energy storage module is discharged, an electrical pulse is generated which may be conveyed to, and received by, a transformer (e.g., a voltage step-up transformer) connected to a load. Possibly, the electrical pulse may be delivered or conveyed directly to the load. The electrical energy storage module may be partially or completely charged and discharged. After the electrical energy storage module has been discharged to generate an electrical pulse, the electrical energy storage module should be charged again in preparation for the next electrical pulse.

In order to carry out the charging and discharging of the electrical energy storage module, a switch or switching device may be included in the electrical pulse generating device, which may selectively connect or disconnect a power supply with the electrical energy storage module. The switch or switching device of an electrical pulse generating device that is based on discharge of an electrical energy storage module such as a capacitor may be referred to as a pulse switch or pulse switching device.

While in the following the electrical energy storage module may be referred to as a capacitor, it is to be understood that more than one capacitor and/or another or other types of electrical energy storage modules than capacitors may possibly be used, e.g., inductive electrical energy storage modules. Thus, even if the electrical energy storage module in the following may be referred to as a capacitor, the disclosure herein is applicable in the same way or similarly for other types of electrical energy storage modules than capacitors.

In power modulators based on discharge of an electrical energy storage module such as a capacitor, the 'droop' in voltage of the capacitor during discharge of the capacitor may cause droop in voltage of the electrical pulse generated by the discharge of the capacitor. The shape of the electrical pulse generated by the discharge of the capacitor may thereby not be 'flat' or substantially 'flat'—i.e. have a constant amplitude or substantially constant amplitude from the trailing edge of the electrical pulse to the leading edge of the electrical pulse—but may have an amplitude that is decreasing (e.g., monotonously decreasing) from the trailing edge of the electrical pulse to the leading edge of the electrical pulse. In many applications such a voltage droop is acceptable, but in some applications, such as driving a microwave amplifier by way of the generated electrical pulses, such a voltage droop may not be acceptable. Also, in many applications in which electrical pulses are generated based on discharge of an electrical energy storage module such as a capacitor, it is desired or even required to have an increased flexibility with regards to shape of the generated electrical pulses that are conveyed to a load. For example, in some applications it may be desired or required for the generated electrical pulses to have a 'flat', or substantially 'flat', shape, while other aspect of the electrical pulses, such as the rise time of the electrical pulses, are of less importance, while in other applications it may not be sufficient with only that the generated electrical pulses have a 'flat' or substantially 'flat' shape, but it may also be required that the electrical pulses have a relatively fast rise time as well.

In view of the above, a concern of the present invention is to provide an electrical pulse generating device that is based on discharge of an electrical energy storage module such as a capacitor, which electrical pulse generating device is capable of providing a relatively high flexibility with regards to shape of the electrical pulses that are generated by the electrical pulse generating device.

To address at least one of this concern and other concerns, an electrical pulse generating device and a method for operating an electrical pulse generating device in accordance with the independent claims are provided. Preferred embodiments are defined by the dependent claims.

According to a first aspect of the present invention, an electrical pulse generating device is provided. The electrical pulse generating device is connected or connectable to a load. The electrical pulse generating device comprises an electrical energy storage module and a power supply configured to selectively charge the electrical energy storage module. The electrical pulse generating device comprises a switching unit configured such that the electrical conductivity of a current path through (e.g., between two terminals of) the switching unit is controllable by transmission of a modulated digital drive signal to the switching unit (e.g., to a terminal of the switching unit), whereby the switching unit is controllably switchable between different operational states thereof based on the digital drive signal. The electrical pulse generating device comprises a control module communicatively connected with the switching unit. The electrical pulse generating device is configured to generate one or more electrical pulses by charging and discharging of the electrical energy storage module, wherein when the electrical energy storage module is discharged, at least a part of an electrical pulse is created to be conveyed to the load. The switching unit is connected to the power supply and to the electrical energy storage module, respectively, such that the power supply charges the electrical energy storage module by way of a charging current supplied by the power supply, or the electrical energy storage module is discharged so as to create an electrical pulse to be conveyed to the load, based on switching of the switching unit between different operational states thereof, wherein the shape of the electrical pulse created by the discharge of the electrical energy storage module is at least in part governed by the modulation of the digital drive signal. The control module is configured to generate a modulated digital drive signal and transmit the digital drive signal to the switching unit. The control module is configured to generate the modulated digital drive signal based on a selected electrical pulse shape such that the shape of the electrical pulse, which is created by the discharge of the electrical energy storage module based on switching of the switching unit between different operational states thereof based on the digital drive signal, conforms to the selected electrical pulse shape.

The modulation of the digital drive signal may possibly be referred to instead as a modulation pattern of the digital drive signal, or simply as a pattern of the digital drive signal.

In the context of the present application, shape of an electrical pulse may relate to one or more of amplitude, rise time, duration, and/or fall time (or pulse decay time) of the electrical pulse. Accordingly, the selected electrical pulse shape may have one or more of a selected amplitude, a selected rise time, a selected duration or a selected fall time.

In the context of the present application, by the shape of the electrical pulse that is created by the discharge of the electrical energy storage module conforming to the selected electrical pulse shape, it may be meant that the shape of the electrical pulse that is created by the discharge of the electrical energy storage module becomes similar to or substantially the same the selected electrical pulse shape, but not necessarily that the shape of the electrical pulse that is created by the discharge of the electrical energy storage module and the selected electrical pulse shape are in exact conformance (but they could be).

As mentioned in the foregoing, the modulated digital drive signal may be generated (e.g., by the control module) based on a selected electrical pulse shape such that the shape of the electrical pulse that is created by the discharge of the electrical energy storage module—based on switching of the switching unit between different operational states thereof based on the digital drive signal—conforms to the selected electrical pulse shape. As also mentioned in the foregoing, the shape of the electrical pulse created by the discharge of the electrical energy storage module is at least in part governed by the modulation of the digital drive signal. Thus, the shape of the electrical pulse that is created by the discharge of the electrical energy storage module may be adjusted or tailored by appropriate choice of the selected electrical pulse shape and modulation of the corresponding digital drive signal. The selected electrical pulse shape and/or the modulation (or modulation pattern) of the corresponding digital drive signal may be predefined (e.g., stored in a memory of the control module) or be input into the control module, e.g., by an operator thereof via a user interface. For example, for a given load, several electrical pulses may be generated for different modulations of the digital drive signal (e.g., for different modulation patterns of the digital drive signal), in order to determine a modulation (or modulation pattern) of the digital drive signal that will result in a shape of the electrical pulse created by the discharge of the electrical energy storage module that conforms to a sufficient extent or degree with the selected electrical pulse shape. In that way, a modulation (or modulation pattern) of the digital drive signal may be determined that corresponds to the selected electrical pulse shape. This may be carried out for several selected electrical pulse shapes.

The switching unit may have at least a conducting state and a non-conducting state. The modulated digital drive signal may be generated such that before the switching unit has become fully conductive, voltage or current applied to the switching unit to switch the switching unit between the different operational states thereof may be turned on and turned off multiple times, or may be continuously turned on and turned off. The voltage or current applied to the switching unit to switch the switching unit between the different operational states thereof may for example constitute a gate pulse, e.g., in case the switch unit has a terminal, the voltage of which determines the electrical conductivity of the switch unit, in the form of a gate. However, the voltage or current applied to the switching unit to switch the switching unit between the different operational states thereof may, e.g., constitute another type of pulse in case the switch unit has another type of terminal, the voltage of which determines the electrical conductivity of the switch unit.

In the following it will be further described how the shape of the electrical pulse that is created by the discharge of the electrical energy storage module may be adjusted or tailored by appropriate choice of the selected electrical pulse shape and modulation of the corresponding digital drive signal. The following description makes reference to a gate of the switch unit, such as in an IGBT or (power) MOSFET, but is applicable in a same or similar manner to switch units having another type of terminal, the voltage of which determines the electrical conductivity of the switch unit.

A first case where the digital drive signal is not modulated is first described, for comparison with principles of embodiments of the present invention. In such a case, the digital drive signal may be generated such that at some point in time, in order to start generating an electrical pulse by discharge of the electrical energy storage module, the gate pulse is turned on. After a certain time, which may depend on at least the size and the type of the switch unit, may become fully conductive. The digital drive signal may further be generated such that after a certain period from the turning on of the gate pulse, the gate pulse is turned off. After a certain time, which may depend on at least the size and the type of the switch unit, may become fully non-conductive. The corresponding digital drive signal for this case may be similar to a rectangular function of, e.g., voltage, as a function of time (cf. FIG. 3, which will be described in the following).

Next, a second case where the digital drive signal is modulated, in accordance with one or more embodiments of the present invention, is described. The described case is mainly focused on how the shape of the leading edge of an electrical pulse created by discharge of the electrical energy storage module can be brought into conformance with a selected (e.g., desired) shape of the leading edge of an electrical pulse. The same or similar principles apply to how other aspect(s) of the shape of the leading edge of an electrical pulse created by discharge of the electrical energy storage module can be brought into conformance with a selected (e.g., desired) shape of an electrical pulse.

The digital drive signal may be generated such that at some point in time, in order to start generating an electrical pulse by discharge of the electrical energy storage module, the gate pulse is turned on. A longer on-period of the gate pulse will generally result in an increased angle of the leading edge (e.g., increase the steepness leading edge) of the electrical pulse, e.g., during the time when the gate pulse is turned on. The digital drive signal may further be generated such that before the switch has become fully conductive, the gate pulse is briefly turned off again for a relatively short duration. A longer off-period of the gate pulse will generally result in a decreased angle (possibly even reaching a negative angle) of the leading edge of the electrical pulse, e.g., during that duration. The decrease in the angle of the leading edge of the electrical pulse may depend at least on the size and the type of the switch unit. The digital drive signal may be generated such that the turning on and turning off of the gate pulse as described above are performed multiple times, for bringing the leading edge of the electrical pulse into conformance with a selected (e.g., desired) shape of the leading edge of an electrical pulse.

The digital drive signal may further be generated such that before the switch unit has become fully conductive, the gate pulse is continuously turned on and turned off, whereby an equilibrium condition in the amplitude of the electrical pulse may be achieved before the switch unit has become fully conductive. This may result in a generally very small amplitude ripple. The equilibrium may be at any percentage of the maximum amplitude of the electrical pulse. Higher amplitude of the electrical pulse may be reached when not in the equilibrium condition.

The digital drive signal may further be generated such that the gate pulse is turned off, subsequent to the switch unit having become fully conductive (the time required for the switch unit to become fully conductive may depend on at least the size and the type of the switch unit). A certain (generally small) time after the gate pulse has been turned off, which may depend on at least the size and the type of the switch unit, may become fully non-conductive.

The same or similar principles as for the above-described second case apply to how other aspect(s) of the shape of an electrical pulse (e.g., other than the shape of the leading edge) created by discharge of the electrical energy storage module can be brought into conformance with a selected (e.g., desired) shape of an electrical pulse.

Using the same of similar principles of modulating the digital drive signal as for the above-described second case, several electrical pulses may be generated for a given load and for different modulations of the digital drive signal (e.g., for different modulation patterns of the digital drive signal), in order to determine a modulation (or modulation pattern) of the digital drive signal that will result in a shape of the electrical pulse created by the discharge of the electrical energy storage module that conforms to a sufficient extent or degree with a selected electrical pulse shape. In that way, a modulation (or modulation pattern) of the digital drive signal may be determined that corresponds to the selected electrical pulse shape.

The load may for example comprise or be constituted by one or more of a microwave amplifier, a klystron, a magnetron, or a particle emitter, such as, for example, an electron emitter (which may be referred to as, for example, an electron gun).

For example, the selected electrical pulse shape may have a relatively fast rise time. Accordingly, the shape of the electrical pulse that is created by the discharge of the electrical energy storage module may thereby obtain a relatively fast rise time. Thus, the rise time of the electrical pulse that is created by the discharge of the electrical energy storage module may be tailored by appropriate choice of the selected electrical pulse shape and modulation of the corresponding digital drive signal. By the attaining of a capability to tailor the rise time of the electrical pulse that is created by the discharge of the electrical energy storage module, so called overshoot at the beginning of the electrical pulse may be reduced or possibly even avoided. For example in case the load comprises or is constituted by a magnetron, the inventors have found out that the rise time of the electrical pulse that is created by the discharge of the electrical energy storage module can be relatively easily adjusted by appropriate choice of the selected electrical pulse shape. The rise time may govern how fast from the beginning of the electrical pulse the magnetron starts to conduct the full current, at which point the magnetron causes microwaves to oscillate within the cavity resonators of the magnetron and generate microwaves.

For the case where the load comprises or is constituted by a magnetron, the inventors have found out that the spectral purity of the microwaves generated by the magnetron may depend on the shape of the electrical pulse that is created by the discharge of the electrical energy storage module. Thus, by adjusting of the shape of the electrical pulse that is created by the discharge of the electrical energy storage module, the degree of spectral purity of the microwaves generated by the magnetron may possibly be adjusted. Further, the inventors have found out that "ignition" of the magnetron (when the magnetron causes microwaves to oscillate within the cavity resonators of the magnetron and generate microwaves) may be achieved at different amplitudes of the electrical pulse that is created by the discharge of the electrical energy storage module, by way of appropriately adjusting the rise time of the electrical pulse that is created by the discharge of the electrical energy storage module.

The electrical pulse generating device may be included in or constitute a power modulator. The electrical pulse generating device or modulator may be connected to the load via one or more cables. At least for the case where the load comprises or is constituted by a magnetron, it has been found by the inventors that the attaining of a capability to tailor the rise time of the electrical pulse that is created by the discharge of the electrical energy storage module may provide an increased flexibility in the length of the one or more cables connecting the electrical pulse generating device or modulator and the load that may be used. For example, the attaining of a capability to tailor the rise time of the electrical pulse that is created by the discharge of the electrical energy storage module may facilitate or allow for employing a relatively large length of the one or more cables connecting the electrical pulse generating device or modulator and the load.

As mentioned, the load may for example comprise or be constituted by a klystron. For the case the load comprises or is constituted by a klystron, the inventors have found out that the rise time, duration, and fall time of the electrical pulse that is created by the discharge of the electrical energy storage module can be relatively easily adjusted by appropriate choice of the selected electrical pulse shape and modulation of the corresponding digital drive signal. The inventors have also found out that the electrical pulse that is created by the discharge of the electrical energy storage module can be relatively easily adjusted by appropriate choice of the selected electrical pulse shape so as to exhibit a 'flat', or substantially 'flat', shape.

The electrical energy storage module may comprise or be constituted by one or more capacitors. In alternative or in addition, the electrical energy storage module may comprise or be constituted by another or other types of electrical energy storage modules than capacitors, e.g., inductive electrical energy storage modules.

In the context of the present application, by a first device, component, etc., being communicatively connected with a second device, component, etc. (e.g., the control module being communicatively connected with the switching unit), it is meant that the devices, components, etc., are able to communicate via wired and/or wireless communication means or techniques, for example via any appropriate wired and/or wireless communication means or techniques as known in the art, for transmitting messages, instructions, data, commands, etc., from the first component to the second component and possibly also vice versa. Wireless communication means may for example comprise radio frequency (RF) communication, infrared communication (e.g., employing a communication link employing infrared light) or another type of free-space optical communication. Wired communication means may for example comprise at least one optical waveguide, or optical transmission line (e.g., an optical fiber), and/or at least one electrical conductor (e.g., a cable or wire, e.g., a copper conductor or cable, or copper wire).

The power supply may for example comprise a power converter. For example, the power supply may comprise or be connectable to an Alternating Current (AC) source, and may further comprise a rectifier for converting AC from the AC source into Direct Current (DC) which can be used to charge the electrical energy storage module.

The electrical energy storage module and the switching unit may be arranged in relation to each other such that the electrical pulse created by the discharge of the electrical energy storage module is conveyed from the electrical energy storage module via the switching unit towards (or to) the load. Thereby, the shape of the electrical pulse created by the discharge of the electrical energy storage module may be at least in part governed by the modulation of the digital drive signal.

The modulated digital drive signal may be generated (e.g., by the control module) such that the switching of the switching unit, between different operational states thereof based on the digital drive signal to discharge the electrical energy storage module, comprises switching the switching unit into and/or out of a linear region operational mode of the switching unit.

The electrical pulse generating device may for example be configured such that the pulse duration of any electrical pulse generated by the electrical pulse generating device is below 100 μs.

The control module may for example include or be constituted by any suitable central processing unit (CPU), microcontroller, digital signal processor (DSP), Application Specific Integrated Circuit (ASIC), Field Programmable Gate Array (FPGA), etc., or any combination thereof. The control module may optionally be capable of executing software instructions stored in a computer program product e.g. in the form of a memory. The memory may for example be any combination of read and write memory (RAM) and read only memory (ROM). The memory may comprise persistent storage, which for example can be a magnetic memory, an optical memory, a solid state memory or a remotely mounted memory, or any combination thereof.

The modulated digital drive signal may be generated (e.g., by the control module) such that the digital drive signal comprises or is constituted by a pulse train. Thus, a pulse train may be input or fed directly into (a terminal of) the switching unit. The pulse train may alternatively be referred to as a pulse amplitude modulated signal. For each or any electrical pulse that the electrical pulse generating device is to generate by discharge of the electrical energy storage module, there may be provided a predefined digital drive signal, e.g., a predefined pulse train. Each predefined digital drive signal may for example comprise or be constituted by a pulse-width modulation (PWM) signal. Each predefined digital drive signal may be generated (e.g., by the control module, or by some other component) based on a corresponding selected electrical pulse shape, such that for each predefined digital drive signal, the shape of the corresponding electrical pulse that is created by the discharge of the electrical energy storage module—based on switching of the switching unit between different operational states thereof based on the predefined digital drive signal—conforms to the selected electrical pulse shape based on which the predefined digital drive signal was generated.

The electrical pulse generating device may comprise a switching unit (or switch, or switch element) controllably switchable between different operating states thereof, e.g., between at least a conducting state and a non-conducting state (or substantially non-conducting state). The switching unit may be connected to the power supply and to the electrical energy storage module, respectively, such that the power supply charges the electrical energy storage module by way of a charging current supplied by the power supply, or the electrical energy storage module is discharged so as to create an electrical pulse to be conveyed to the load, based on switching of the switching unit between different operational states thereof, for example based on switching of the switching unit between at least the conducting state and the (substantially) non-conducting state thereof.

The switching unit may for example be a power semiconductor-based switching unit.

The switching unit may for example comprise one or more solid-state semiconductor switching devices with turn-on and turn-off capability, such as, for example, at least one Insulated-Gate Bipolar Transistor (IGBT), Integrated Gate-Commutated Transistor (IGCT), metal oxide semiconductor field effect transistor (MOSFET) and/or gate turn-off thyristor (GTO), but is not limited thereto. The switching unit may for example comprise or be constituted by one or more IGBTs and/or MOSFETs (e.g., power MOSFETs), but is not limited thereto. In the context of the present application, by a switching unit it is meant an electrical device or element which is capable of switching (parts or portions of) electrical signals or electrical power, and which may also be capable of attenuating or blocking and/or amplifying electrical signals or electrical power. The switching unit could in alternative—in accordance with one or more embodiments of the present invention—be referred to as a switching transistor element. The switching unit may for example be a power semiconductor-based switching unit. The switching unit may comprise at least one transistor or transistor device and/or another or other types of (power) semiconductor devices. According to another example, the switching unit may for example comprise or be constituted by one or more field-effect transistors (FETs), for example MOSFETs as mentioned in the foregoing and/or junction gate FETs (JFETs).

On a more general note, the switching unit may for example comprise at least a first terminal, a second terminal and a third terminal. The switching unit may be arranged such that current may flow in a current path between the first terminal and the second terminal, and such that at least the third terminal governs the electrical conductivity of the current path between the first terminal and the second terminal based on voltage or current applied to at least the third terminal and one of the first terminal and the second terminal. The switching unit may be controllably switchable between different operational states thereof by changing of the voltage or current applied to the third terminal and one of the first terminal and the second terminal. The switching unit may for example comprise or be constituted by an IGBT or a MOSFET, wherein the third terminal may be a gate of the IGBT or MOSFET. The digital drive signal may comprise or be constituted by a digital gate drive signal receivable by the gate of the IGBT or MOSFET.

The operational states of the switching unit may include at least one non-conducting state of the switching unit and at least one conducting state of the switching unit.

In the context of the present application, by a non-conducting state of the switching unit it is meant a state where there is no or only very little conduction of current through the switching unit. Thus, the switching unit may be switchable so as to stop, or substantially stop, the switching unit from conducting current through the switching unit.

As indicated in the foregoing, the switching unit may have at least a conducting state and a non-conducting state. The modulated digital drive signal may be generated such that before the switching unit has become fully conductive, voltage or current applied to the third terminal to switch the switching unit between the different operational states thereof may be turned on and turned off multiple times, or may be continuously turned on and turned off.

The operational states of the switching unit may include a so called ohmic mode of the switching unit. The ohmic mode of the switching unit may instead be referred to as a linear region operational state of the switching unit. The linear region operational state of the at least one switching unit may be a state which is intermediate a conducting state and a non-conducting state of the switching unit, such that when the switching unit is being switched between the conducting state and the non-conducting state, the switching unit may momentarily enter the linear region operational state before the switching unit enters the conducting state or the non-conducting state, which may be referred to as the switching unit passing the linear region operational state.

In the context of the present application, by ohmic mode or linear region operational mode of the switching unit, it is meant a part of the active region of the switching unit (e.g., comprising a transistor) wherein the output voltage of the switching unit or transistor is linearly (or substantially linearly) dependent on the input voltage of the switching unit or transistor. Thus, when the switching unit is operating in ohmic mode, or linear region operational state, the switching unit is not shut off, but may still conduct current therethrough at least to some extent.

The electrical pulse generating device may be configured to generate at least a first electrical pulse and a second electrical pulse, the second electrical pulse succeeding the first electrical pulse, by charging and discharging of the electrical energy storage module repeatedly.

A modulated first digital drive signal may be generated (e.g., by the control module) based on a first selected electrical pulse shape such that the shape of the first electrical pulse, which is created by the discharge of the electrical energy storage module based on switching of the switching unit between different operational states thereof based on the first digital drive signal, conforms to the first selected electrical pulse shape.

A modulated second digital drive signal may be generated (e.g., by the control module) based on a second selected electrical pulse shape such that the shape of the second electrical pulse, which is created by the discharge of the electrical energy storage module based on switching of the switching unit between different operational states thereof based on the second digital drive signal, conforms to the second selected electrical pulse shape. One or more of for example the amplitude, the rise time, the duration or the fall time of the first electrical pulse shape and the second electrical pulse shape may be different. One or more of for example the amplitude, the rise time, the duration or the fall time of the first electrical pulse shape and the second electrical pulse shape may be the same.

For example, the amplitude of first electrical pulse shape may be different from the amplitude of the second electrical pulse shape. By the amplitude of first electrical pulse shape being different from the amplitude of the second electrical pulse shape, the energies of the first electrical pulse and the second electrical pulse may be different.

According to a second aspect of the present invention, a method for operating an electrical pulse generating device is provided. The electrical pulse generating device is connected or connectable to a load. The electrical pulse generating device comprises an electrical energy storage module, a power supply, which is configured to selectively charge the electrical energy storage module, and a switching unit. The switching unit is configured such that the electrical conductivity of a current path through the switching unit is controllable by transmission of a modulated digital drive signal to the switching unit, whereby the switching unit is controllably switchable between different operational states thereof based on the digital drive signal. The electrical pulse generating device is configured to generate one or more electrical pulses by charging and discharging of the electrical energy storage module, wherein when the electrical energy storage module is discharged, at least a part of an electrical pulse is created to be conveyed to the load, wherein the switching unit is connected to the power supply and to the electrical energy storage module, respectively, such that the power supply charges the electrical energy storage module by way of a charging current supplied by the power supply, or the electrical energy storage module is discharged so as to create an electrical pulse to be conveyed to the load, based on switching of the switching unit between different operational states thereof. The shape of the electrical pulse created by the discharge of the electrical energy storage module is at least in part governed by the modulation of the digital drive signal.

The method according to the second aspect of the present invention comprises generating a modulated digital drive signal, and transmitting the digital drive signal to the switching unit. The modulated digital drive signal is generated based on a selected electrical pulse shape such that the shape of the electrical pulse, which is created by the discharge of the electrical energy storage module based on switching of the switching unit between different operational states thereof based on the digital drive signal, conforms to the selected electrical pulse shape.

The switching unit may have at least a conducting state and a non-conducting state. The modulated digital drive signal may be generated such that before the switching unit has become fully conductive, voltage or current applied to the switching unit to switch the switching unit between the different operational states thereof may be turned on and turned off multiple times, or may be continuously turned on and turned off.

According to a third aspect of the present invention, a computer program is provided. The computer program comprises instructions, which when executed by one or more processors comprised in a control module, cause the control module to perform the method according to the second aspect of the present invention.

According to a fourth aspect of the present invention, a processor-readable medium is provided. The processor-readable medium has a computer program loaded thereon, wherein the computer program comprises instructions, which, when executed by one or more processors comprised in a control module, cause the control module to perform the method according to the second aspect of the present invention.

Each or any of the one or more processors may for example comprise a CPU, a microcontroller, a DSP, an ASIC, an FPGA, etc., or any combination thereof.

The processor-readable medium may for example include a Digital Versatile Disc (DVD) or a floppy disk or any other suitable type of processor-readable means or processor-readable (digital) medium, such as, but not limited to, a memory such as, for example, nonvolatile memory, a hard disk drive, a Compact Disc (CD), a Flash memory, magnetic tape, a Universal Serial Bus (USB) memory device, a Zip drive, etc.

According to a fifth aspect of the present invention, a system is provided. The system comprises a load and an electrical pulse generating device according to the first aspect, which electrical pulse generating device is connected to the load. As mentioned, the load may for example comprise or be constituted by one or more of a microwave amplifier, a klystron, a magnetron, or a particle emitter, such as, for example, an electron emitter.

Further objects and advantages of the present invention are described in the following by means of exemplifying embodiments. It is noted that the present invention relates to all possible combinations of features recited in the claims. Further features of, and advantages with, the present invention will become apparent when studying the appended claims and the description herein. Those skilled in the art realize that different features of the present invention can be combined to create embodiments other than those described herein.

BRIEF DESCRIPTION OF THE DRAWINGS

Exemplifying embodiments of the present invention will be described below with reference to the accompanying drawings.

Figure 3:
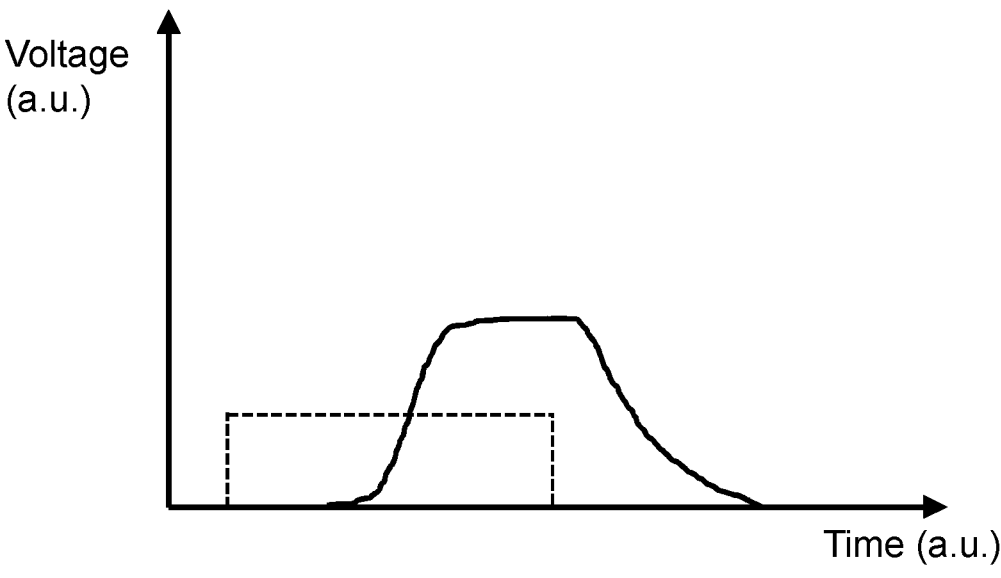
Figure 4:
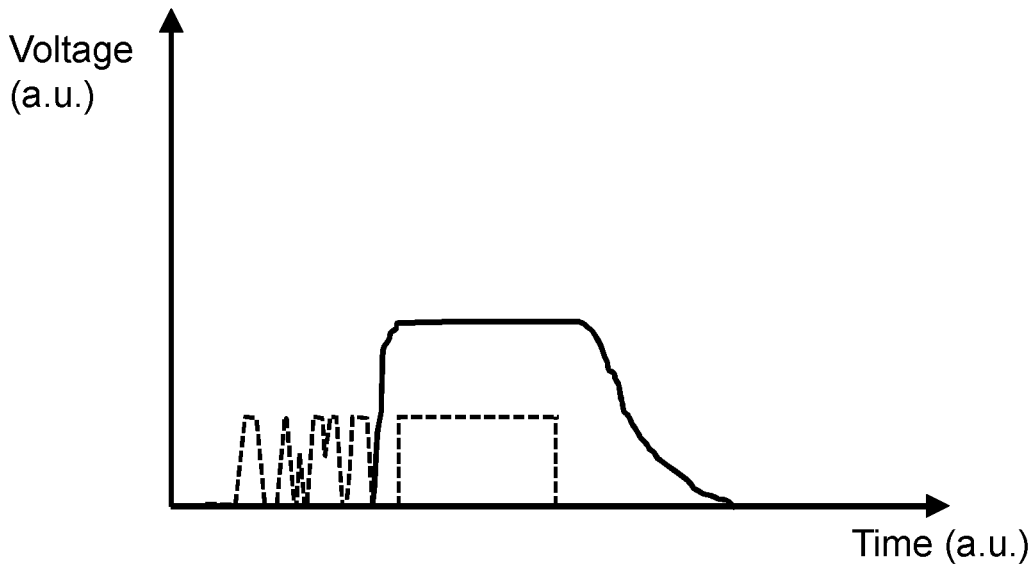

Each of FIGS. 3 and 4 is a schematic graph of voltages of a digital drive signal and a corresponding electrical pulse as a function of time, for illustrating principles of one or more embodiments of the present invention.

Figure 5:
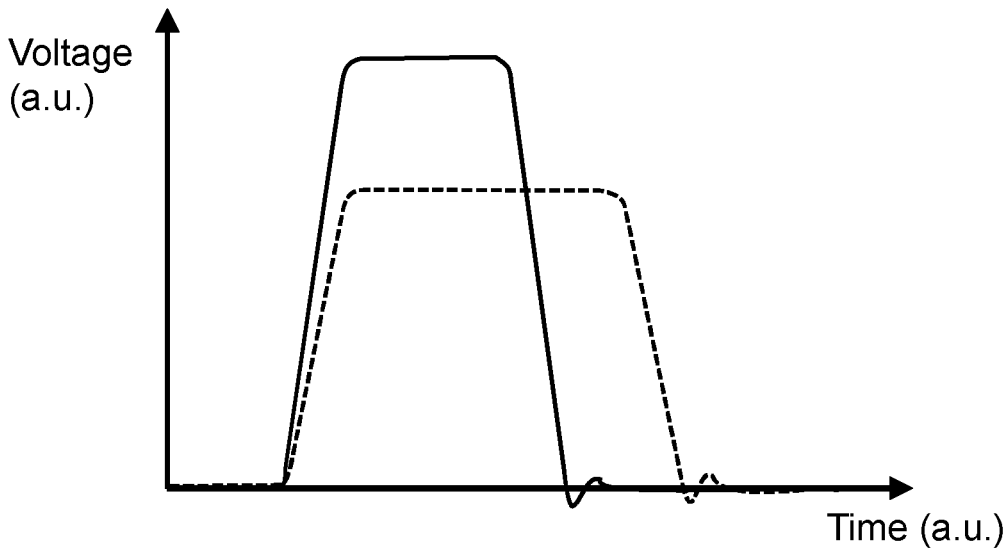
Figure 6:
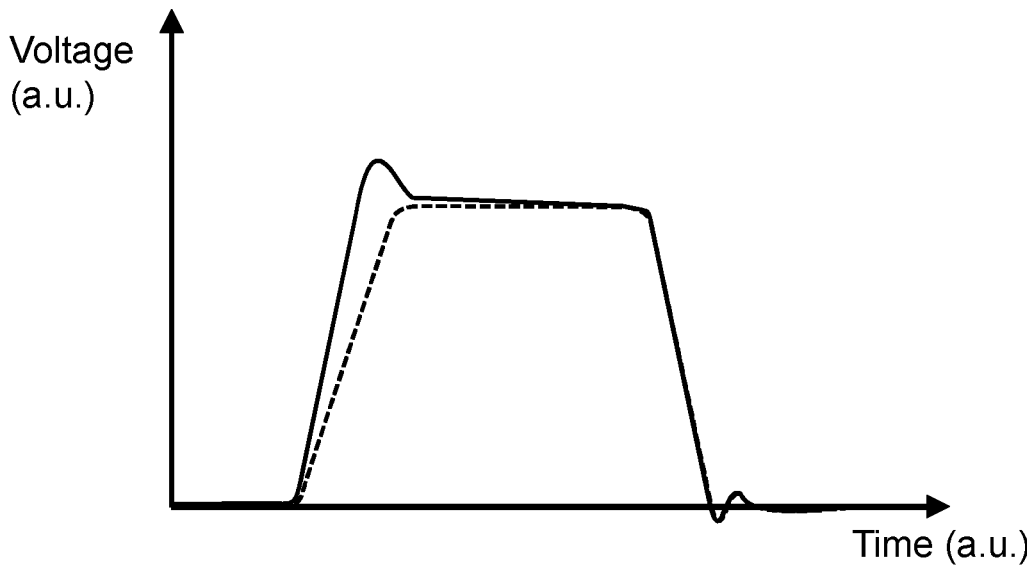

FIGS. 5 and 6 are schematic graphs of voltage of electrical pulses as a function of time, for illustrating principles of one or more embodiments of the present invention.

Figure 7:
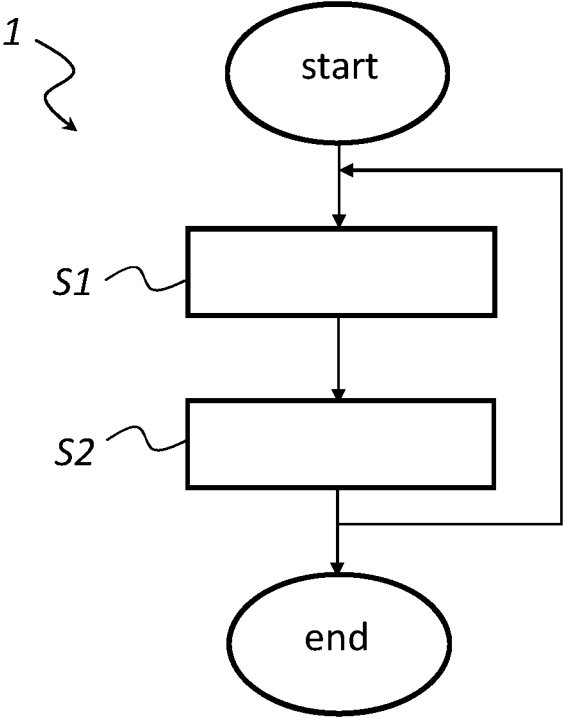

FIG. 7 is a schematic flowchart of a method according to an embodiment of the present invention.

All the figures are schematic, not necessarily to scale, and generally only show parts which are necessary in order to elucidate embodiments of the present invention, wherein other parts may be omitted or merely suggested.

DETAILED DESCRIPTION

The present invention will now be described hereinafter with reference to the accompanying drawings, in which exemplifying embodiments of the present invention are shown. The present invention may, however, be embodied in many different forms and should not be construed as limited to the embodiments of the present invention set forth herein; rather, these embodiments are provided by way of example so that this disclosure will convey the scope of the present invention to those skilled in the art.

Figure 1:
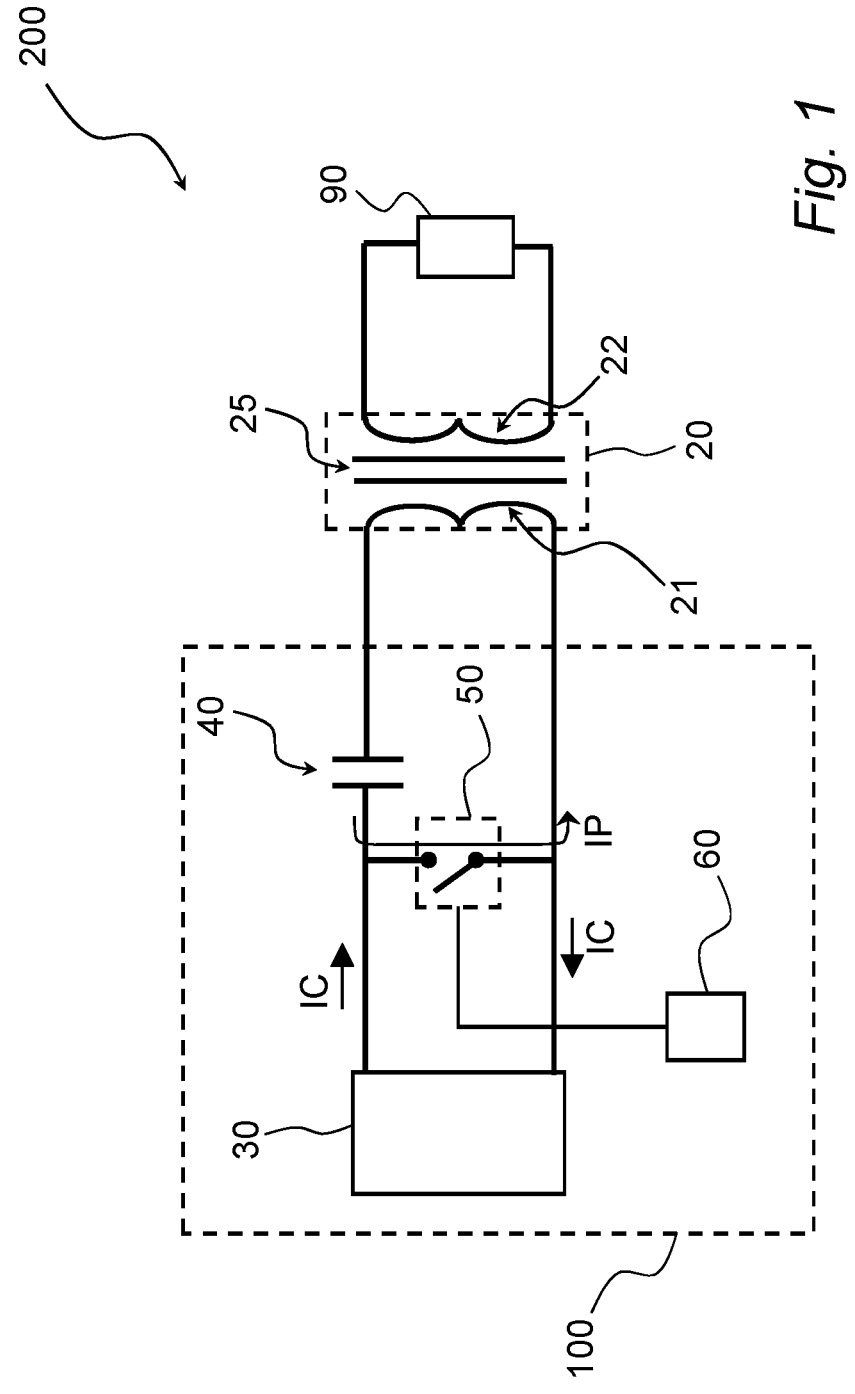
FIGS. 1 and 2 are schematic views of a system according to embodiments of the present invention.

FIG. 1 is a schematic view of a system 200 according to an embodiment of the present invention. The system 200 comprises an electrical pulse generating device 100 that is connected (or connectable) to a load 90. The load 90 may for example comprise or be constituted by one or more of a microwave amplifier, a klystron, a magnetron, or a particle emitter, such as, for example, an electron emitter (which may be referred to as an electron gun).

The electrical pulse generating device 100 comprises an electrical energy storage module 40, and a power supply 30, which is configured to selectively charge the electrical energy storage module 40.

In accordance with the embodiment of the present invention illustrated in FIG. 1, the electrical energy storage module 40 comprises a capacitor. It is however to be understood that the electrical energy storage module 40 could comprise several capacitors (e.g., a capacitor bank) and/or another or other types of electrical energy storage modules than capacitors, e.g., inductive electrical energy storage modules.

The power supply 30 may for example comprise a power converter. For example, the power supply may comprise or be connectable to an Alternating Current (AC) source (not shown in FIG. 1), and may further comprise a rectifier (not shown in FIG. 1) for converting AC from the AC source into Direct Current (DC) which can be used to charge the electrical energy storage module 40. For example, the power supply 30 may be connectable or connected to a power source (not shown in FIG. 1) that is supplying AC power, having one phase or a plurality of phases. The power source could for example be configured to supply three-phase AC power. The power source could for example comprise or be constituted by an electrical grid, which may supply three-phase AC power, e.g., mains electric power. The power supply 30 could comprise an input rectifier (not shown in FIG. 1). The input rectifier may be is arranged to receive the AC power supplied by the power source when the power supply 30 is connected to the power source. The input rectifier may for example comprise or be constituted by a multi-phase rectifier, which may comprise a plurality of phase legs.

The electrical pulse generating device 100 comprises a switching unit 50. The switching unit 50 is configured such that the electrical conductivity of a current path through the switching unit 50 is controllable by transmission of a modulated digital drive signal to the switching unit 50, whereby the switching unit 50 is controllably switchable between different operational states thereof based on the digital drive signal. The switching unit 50 may for example comprise one or more solid-state semiconductor switching devices with turn-on and turn-off capability, such as, for example, at least one Insulated-Gate Bipolar Transistor (IGBT), Integrated Gate-Commutated Transistor (IGCT), metal oxide semiconductor field effect transistor (MOSFET) and/or gate turn-off thyristor (GTO), but is not limited thereto. The switching unit 50 may for example comprise or be constituted by one or more IGBTs and/or MOSFETs (e.g., power MOSFETs).

The electrical pulse generating device 100 comprises a control module 60, which is communicatively connected with the switching unit 50. The control module 60, or at least one processor comprised in the control module 60, may for example comprise a CPU, a microcontroller, a DSP, an ASIC, an FPGA, etc., or any combination thereof.

The electrical pulse generating device 100 is configured to generate one or more electrical pulses by charging and discharging of the electrical energy storage module 40, wherein when the electrical energy storage module 40 is discharged, at least a part of an electrical pulse is created to be conveyed to the load 90. The switching unit 50 is connected to the power supply 30 and to the electrical energy storage module 40, respectively, such that the power supply 30 charges the electrical energy storage module 40 by way of a charging current supplied by the power supply 30, or the electrical energy storage module 40 is discharged so as to create an electrical pulse to be conveyed to the load 90, based on switching of the switching unit 50 between different operational states thereof.

A shape of the electrical pulse created by the discharge of the electrical energy storage module 40 is at least in part governed by the modulation of the digital drive signal. In accordance with the embodiment of the present invention illustrated in FIG. 1, the electrical energy storage module 40 and the switching unit 50 may be arranged in relation to each other such that the electrical pulse created by the discharge of the electrical energy storage module 40 is conveyed from the electrical energy storage module 40 via the switching unit 50 towards (or to) the load 90. Thereby, the shape of the electrical pulse created by the discharge of the electrical energy storage module 40 may be at least in part governed by the modulation of the digital drive signal.

In accordance with the embodiment of the present invention illustrated in FIG. 1, the charging current that may be supplied by the power supply 30, based on switching of the switching unit 50 between different operational states thereof, may flow out of the power supply 30 via the conductor of the two conductors connected to the power supply 30 that is uppermost in FIG. 1, and return to the power supply 30 via the conductor of the two conductors connected to the power supply 30 that is lowermost in FIG. 1, as indicated by the arrows IC in FIG. 1. The two above-mentioned conductors may for example be connected to two terminals of the power supply 30.

The control module 60 is configured to generate a modulated digital drive signal and transmit the digital drive signal to the switching unit 50. The control module 60 is configured to generate the modulated digital drive signal based on a selected electrical pulse shape such that the shape of the electrical pulse, which is created by the discharge of the electrical energy storage module 40 based on switching of the switching unit 50 between different operational states thereof based on the digital drive signal, conforms to the selected electrical pulse shape.

As described in the foregoing with reference to "the first aspect of the present invention", the shape of the electrical pulse that is created by the discharge of the electrical energy storage module 40 may be adjusted or tailored by appropriate choice of the selected electrical pulse shape and modulation of the corresponding digital drive signal. The selected electrical pulse shape may have one or more of a selected amplitude, a selected rise time, a selected duration or a selected fall time. For example, for a given load 90 (or type of load), several electrical pulses may be generated for different modulations of the digital drive signal (e.g., for different modulation patterns of the digital drive signal), in order to determine a modulation (or modulation pattern) of the digital drive signal that will result in a shape of the electrical pulse created by the discharge of the electrical energy storage module 40 that conforms to a sufficient extent or degree with the selected electrical pulse shape. In that way, a modulation (or modulation pattern) of the digital drive signal may be determined that corresponds to the selected electrical pulse shape. This may be carried out for several selected electrical pulse shapes.

In accordance with the embodiment of the present invention illustrated in FIG. 1, the system 200 comprises a transformer 20. As illustrated in FIG. 1, the transformer 20 is arranged such that any electrical pulse generated by discharge of the electrical energy storage module 40 is conveyed to the load 90 via the transformer 20. The transformer 20 may comprise at least one core 25. The transformer 20 may comprise at least one primary winding 21 by which the transformer 20 may be connected to the electrical pulse generating device 100. For example, the transformer 20 may be connected to the electrical pulse generating device 100 by way of two terminals thereof, as illustrated in FIG. 1. In accordance with the embodiment of the present invention illustrated in FIG. 1 and as indicated therein, the transformer 20 may comprise two primary windings 21 by which the transformer 20 may be connected to the electrical pulse generating device 100. However, it is to be understood that the number of primary windings of the transformer 20 by which the transformer 20 may be connected to the electrical pulse generating device 100 is not limited to two, but may for example be larger than two. The primary winding(s) of the transformer 20 may be configured to receive the electrical pulse(s) generated by the electrical pulse generating device 100. As illustrated in FIG. 1, the transformer may be connected to the load 90 via secondary windings 22 of the transformer 20. It is to be understood that the number of secondary windings of the transformer 20 is not limited to two, as illustrated in FIG. 1, but may for example be larger than two.

Figure 2:
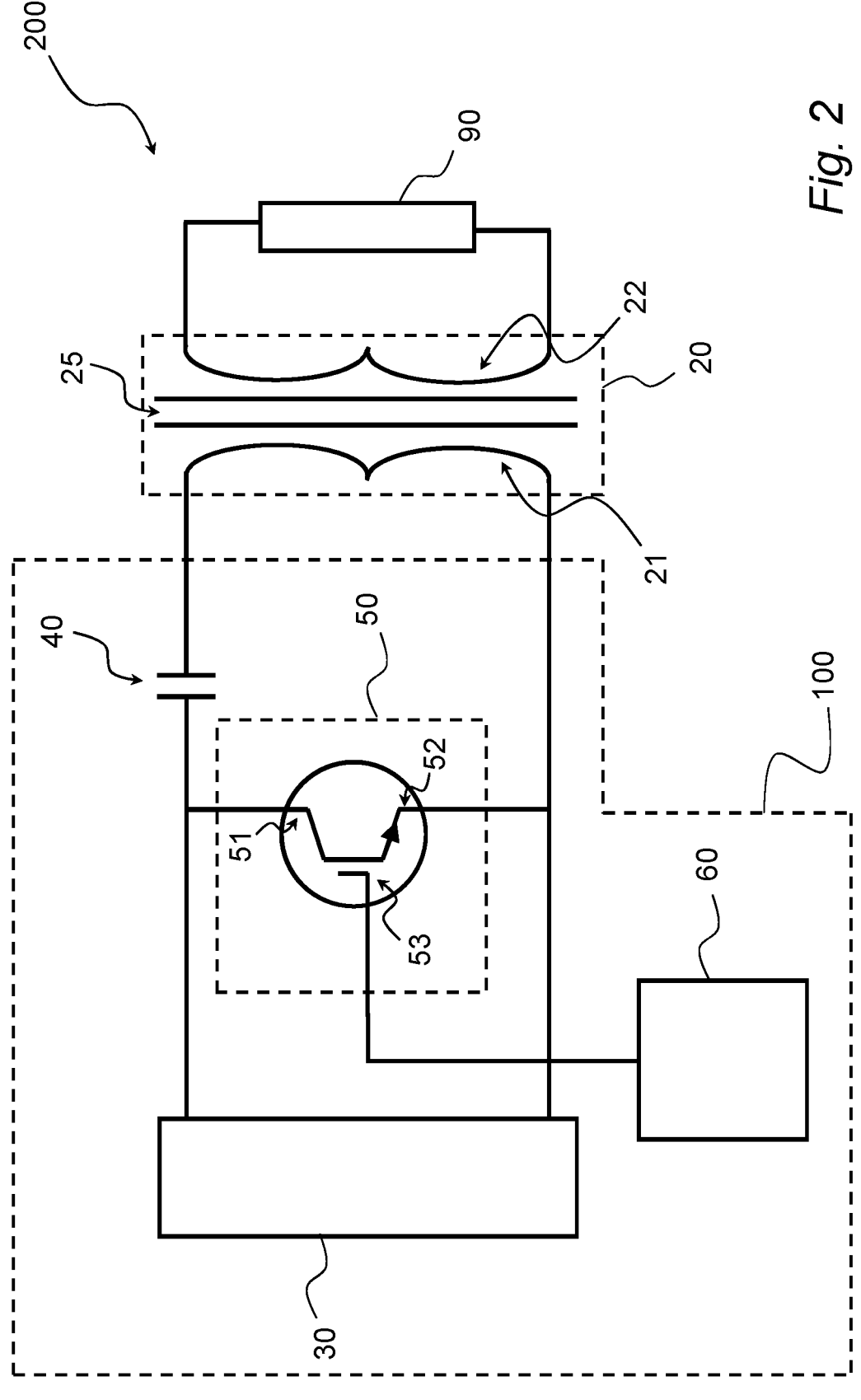

FIG. 2 is a schematic view of a system 200 according to an embodiment of the present invention. The system 200 illustrated in FIG. 2 is similar to (or possibly the same as) the system 200 illustrated in FIG. 1, and the same reference numerals in FIGS. 1 and 2 denote the same or similar components, having the same or similar function.

FIG. 2 illustrates how the switching unit 50 may be realized in an electrical pulse generating device or a system as disclosed herein. In accordance with the embodiment of the present invention illustrated in FIG. 2, the switching unit 50 comprises a first terminal 51, a second terminal 52 and a third terminal 53, and the switching unit 50 is arranged such that current may flow in a current path between the first terminal 51 and the second terminal 52, and such that at least the third terminal 53 governs the electrical conductivity of the current path between the first terminal 51 and the second terminal 52 based on voltage or current applied to at least the third terminal 53 and one of the first terminal 51 and the second terminal 52. The switching unit 50 may be controllably switchable between different operational states thereof by changing of the voltage or current applied to the third terminal 53 and one of the first terminal 51 and the second terminal 52. The switching unit 50 may for example comprise or be constituted by an IGBT.

Each of FIGS. 3 and 4 is a schematic graph of voltages of a digital drive signal and a corresponding electrical pulse as a function of time (voltage and time are given in arbitrary units), for illustrating principles of one or more embodiments of the present invention.

FIG. 3 schematically illustrates a digital drive signal (dashed line) which is not modulated, and an electrical pulse (solid line) created by the discharge of the electrical energy storage module based on switching of the switching unit between different operational states thereof based on the digital drive signal.

FIG. 4 schematically illustrates a digital drive signal (dashed line), which is modulated over approximately half of a duration thereof, and an electrical pulse (solid line) created by the discharge of the electrical energy storage module based on switching of the switching unit between different operational states thereof based on the modulated digital drive signal. As mentioned, the shape of the electrical pulse created by the discharge of the electrical energy storage module is at least in part governed by the modulation of the digital drive signal. Compared to the electrical pulse illustrated in FIG. 3, the electrical pulse illustrated in FIG. 4 has a different rise time, effected by the selected modulation (or modulation pattern) of the digital drive signal. It is to be understood that the modulation of the digital drive signal illustrated in FIG. 4 is schematic and exemplifying for illustrating principles of one or more embodiments of the present invention.

FIGS. 5 and 6 are schematic graphs illustrating voltage of electrical pulses as a function of time, for illustrating principles of one or more embodiments of the present invention.

FIG. 5 schematically illustrates voltages of a first electrical pulse (solid line) and a second electrical pulse (dashed line), which first and second electrical pulses have been created by the discharge of the electrical energy storage module based on switching of the switching unit between different operational states thereof based on respective first and second modulated digital drive signals (not shown in FIG. 5). FIG. 5 illustrates that by changing the modulation of the digital drive signal, the shape of the electrical pulse, created by the discharge of the electrical energy storage module based on switching of the switching unit between different operational states thereof based on the digital drive signal, can be changed so as to obtain a different amplitude and/or duration of the electrical pulse. As shown in FIG. 5, the first electrical pulse (solid line) and the second electrical pulse (dashed line) have different amplitude and duration. In general, one or more of for example the amplitude, the rise time, the duration or the fall time may be different between the first electrical pulse and the second electrical pulse.

FIG. 6 schematically illustrates voltages of a first electrical pulse (solid line) and a second electrical pulse (dashed line) which first and second electrical pulses have been created by the discharge of the electrical energy storage module based on switching of the switching unit between different operational states thereof based on respective first and second modulated digital drive signals (not shown in FIG. 6). FIG. 6 illustrates that by changing the modulation of the digital drive signal, the shape of the electrical pulse, created by the discharge of the electrical energy storage module based on switching of the switching unit between different operational states thereof based on the digital drive signal, can be changed so as to obtain a different rise time of the electrical pulse and further to reduce so called overshoot at the beginning of the electrical pulse. As shown in FIG. 6, the first electrical pulse (solid line) and the second electrical pulse (dashed line) have different rise time, and the second electrical pulse (dashed line) has a reduced overshoot compared to the first electrical pulse (solid line).

FIG. 7 is a schematic flowchart of a method 1 according to an embodiment of the present invention. The method 1 is for operating an electrical pulse generating device, which is connected or connectable to a load. The electrical pulse generating device comprises an electrical energy storage module, a power supply, which is configured to selectively charge the electrical energy storage module, and a switching unit. The switching unit is configured such that the electrical conductivity of a current path through the switching unit is controllable by transmission of a modulated digital drive signal to the switching unit, whereby the switching unit is controllably switchable between different operational states thereof based on the digital drive signal. The electrical pulse generating device is configured to generate one or more electrical pulses by charging and discharging of the electrical energy storage module, wherein when the electrical energy storage module is discharged, at least a part of an electrical pulse is created to be conveyed to the load, wherein the switching unit is connected to the power supply and to the electrical energy storage module, respectively, such that the power supply charges the electrical energy storage module by way of a charging current supplied by the power supply, or the electrical energy storage module is discharged so as to create an electrical pulse to be conveyed to the load, based on switching of the switching unit between different operational states thereof. The shape of the electrical pulse created by the discharge of the electrical energy storage module is at least in part governed by the modulation of the digital drive signal.

The method 1 comprises, at S1, generating a modulated digital drive signal, and, at S2, transmitting the digital drive signal to the switching unit. The modulated digital drive signal is generated based on a selected electrical pulse shape such that the shape of the electrical pulse, which is created by the discharge of the electrical energy storage module based on switching of the switching unit between different operational states thereof based on the digital drive signal, conforms to the selected electrical pulse shape.

The method 1 may then end.

By the method 1, an electrical pulse may be created by the discharge of the electrical energy storage module, based on switching of the switching unit between different operational states thereof based on the digital drive signal, wherein the electrical pulse has a shape that conforms to the selected electrical pulse shape.

The method 1 may however not end, and the steps S1 and S2 may be carried out repeatedly, e.g., over a period of time, as indicated by the line immediately before "end" going back to immediately after "start". Accordingly, the method 1 may be used to create several (e.g., a succession) of electrical pulses, each of which having a shape that conforms to a selected electrical pulse shape (which may the same or different for different ones of the electrical pulses).

While the present invention has been illustrated in the appended drawings and the foregoing description, such illustration is to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. In the appended claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A device for generating an electrical pulse to a load, the device comprising:
   an electrical energy storage module to generate one or more electrical pulses by charging and/or discharging, wherein when the electrical energy storage module is discharged, at least a part of an electrical pulse is created to be conveyed to the load;
   a power supply configured to selectively charge the electrical energy storage module;
   a switching unit connected to the power supply and to the electrical energy storage module, the switching unit configured such that the electrical conductivity of a current path through the switching unit is controllable by transmission of a modulated digital drive signal to the switching unit, whereby the switching unit is controllably switchable between different operational states to produce an electrical pulse shape created by the discharge of the electrical energy storage module at least in part governed by the modulation of the digital drive signal; and
   a control module connected with the switching unit, wherein the control module is configured to generate the modulated digital drive signal and transmit the modulated digital drive signal to the switching unit, wherein the control module is configured to generate the modulated digital drive signal based on a selected electrical pulse shape,
   wherein the switching unit has at least a conducting state and a nonconducting state, and wherein the modulated digital drive signal is generated such that before the switching unit has become fully conductive, voltage or current applied to the switching unit to switch the switching unit between the different operational states thereof is turned on and turned off multiple times or is continuously turned on and turned off.

2. The device of claim 1, wherein the selected electrical pulse shape has one or more of a selected amplitude, a selected rise time, a selected duration, or a selected fall time.

3. The device of claim 1, wherein the electrical pulse is conveyed from the electrical energy storage module via the switching unit towards the load, whereby the shape of the electrical pulse created by the discharge of the electrical energy storage module is at least in part governed by the modulation of the digital drive signal.

4. The device of claim 1, wherein the switching unit is a power semiconductor-based switching unit.

5. The device of claim 1, wherein the modulated digital drive signal switches the switching unit into and/or out of a linear region operational mode.

6. The device of claim 1, wherein the modulated digital drive signal comprises a pulse train.

7. The device of claim 1, wherein a pulse duration of any electrical pulse generated by the device is below 100 µs.

8. The device of claim 1, wherein the switching unit comprises at least a first terminal, a second terminal, and a third terminal, and being arranged such that current may flow in a current path between the first terminal and the second terminal and such that at least the third terminal governs the electrical conductivity of the current path between the first terminal and the second terminal based on voltage or current applied to at least the third terminal and one of the first terminal and the second terminal, wherein the switching unit is controllably switchable between different operational states thereof by changing of the voltage or current applied to the third terminal and one of the first terminal and the second terminal.

9. The device of claim 8, wherein the switching unit has at least a conducting state and a non-conducting state, and wherein the modulated digital drive signal is generated before the switching unit has become fully conductive.

10. The device of claim 9, wherein voltage or current applied to the switching unit to switch the switching unit between the different operational states is turned on and turned off multiple times.

11. The device of claim 9, wherein voltage or current applied to the switching unit to switch the switching unit between the different operational states is continuously turned on and turned off.

12. The device of claim 8, wherein the switching unit comprises an Insulated-Gate Bipolar Transistor (IGBT) or a metal oxide semiconductor field effect transistor (MOSFET), wherein the third terminal is a gate of the IGBT or MOSFET, and wherein the modulated digital drive signal comprises a digital gate drive signal receivable by the gate of the IGBT or MOSFET.

13. The device of claim 1, wherein the electrical energy storage module is configured to generate at least a first electrical pulse and a succeeding second electrical pulse by charging and discharging repeatedly, wherein each pulse has a different selected electrical pulse shape, and wherein one or more of the amplitude, the rise time, the duration, or the fall time of the first electrical pulse shape and the second electrical pulse shape are different.

14. The device of claim 1, wherein the electrical energy storage module is configured to generate at least a first electrical pulse and a succeeding second electrical pulse by charging and discharging repeatedly, and wherein one or more of the amplitude, the rise time, the duration, or the fall time of the first electrical pulse shape and the second electrical pulse shape are the same.

15. A method, comprising:
   selecting an electrical pulse shape to be created by a discharge of an electrical energy storage module based on switching of a switching unit between different operational states thereof;
   generating a modulated digital drive signal, wherein the electrical conductivity of a current path through the switching unit is controllable by transmission of the modulated digital drive signal, wherein before the switching unit has become fully conductive, applying voltage or current to the switching unit to switch the switching unit between the different operational states, wherein the voltage or current is turned on and turned off multiple times or wherein the voltage or current is continuously turned on and turned off;
   transmitting the modulated digital drive signal to the switching unit; and
   generating an electrical pulse that conforms to the selected electrical pulse shape.

* * * * *